(12) United States Patent
Zhou et al.

(10) Patent No.: US 8,441,592 B2
(45) Date of Patent: May 14, 2013

(54) TFT-LCD ARRAY SUBSTRATE AND MANUFACTURING METHOD THEREOF

(75) Inventors: Weifeng Zhou, Beijing (CN); Zhenyu Xie, Beijing (CN); Jian Guo, Beijing (CN); Xing Ming, Beijing (CN); Xin Zhao, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 235 days.

(21) Appl. No.: 12/886,894

(22) Filed: Sep. 21, 2010

(65) Prior Publication Data

US 2011/0069247 A1 Mar. 24, 2011

(30) Foreign Application Priority Data

Sep. 24, 2009 (CN) .......................... 2009 1 0093485

(51) Int. Cl.
*G02F 1/136* (2006.01)
*G02F 1/1333* (2006.01)

(52) U.S. Cl.
USPC ........................................... 349/43; 349/138

(58) Field of Classification Search ................ 349/43, 349/138
See application file for complete search history.

(56) References Cited

U.S. PATENT DOCUMENTS

| | | | |
|---|---|---|---|
| 7,056,777 B2* | 6/2006 | Kim et al. | 438/158 |
| 7,199,846 B2* | 4/2007 | Lim | 349/43 |
| 7,205,571 B2* | 4/2007 | Ahn et al. | 257/72 |
| 7,602,464 B2* | 10/2009 | Seo et al. | 349/138 |
| 7,643,101 B2* | 1/2010 | Oh et al. | 349/43 |
| 7,820,477 B2* | 10/2010 | Seo et al. | 438/99 |
| 8,158,470 B2* | 4/2012 | Choung et al. | 438/158 |
| 2001/0022639 A1* | 9/2001 | Kwak et al. | 349/122 |
| 2003/0133055 A1* | 7/2003 | Um et al. | 349/43 |
| 2004/0201789 A1* | 10/2004 | Akiyama | 349/43 |
| 2005/0263769 A1 | 12/2005 | Chul Ahn | |
| 2006/0232721 A1* | 10/2006 | Um et al. | 349/43 |
| 2007/0252934 A1* | 11/2007 | Seo et al. | 349/138 |
| 2009/0225249 A1* | 9/2009 | Wang et al. | 349/43 |
| 2011/0069247 A1* | 3/2011 | Zhou et al. | 349/43 |

FOREIGN PATENT DOCUMENTS

| | | |
|---|---|---|
| CN | 1702530 A | 11/2005 |
| JP | 2008-166765 A | 7/2008 |
| KR | 20080042756 A | 5/2008 |

OTHER PUBLICATIONS

KIPO Notice of Allowance of Patent dated Sep. 19, 2012; Appln. No. 10-2010-0092524.

* cited by examiner

*Primary Examiner* — Rhonda Peace
(74) *Attorney, Agent, or Firm* — Ladas & Parry LLP

(57) ABSTRACT

A method of manufacturing a thin film transistor liquid crystal display (TFT-LCD) array substrate comprises: forming a gate line and a gate electrode on a base substrate, and then depositing a gate insulating layer on the base substrate; forming an active layer, a data line, a source electrode, and a drain electrode on the gate insulating layer, and removing the gate insulating layer in the region other than the regions of the active layer, the data line, the source electrode and the drain electrode; forming a first via hole, a second via hole and a third via hole in a photoresist layer by an exposing and developing process; and forming a pixel electrode, a first connection electrode and a second connection electrode on the photosensitive resin layer. The pixel electrode is connected with the drain electrode through the third via hole.

8 Claims, 8 Drawing Sheets

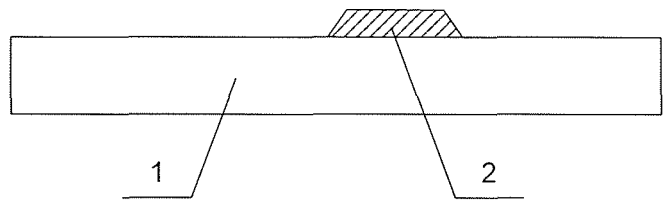
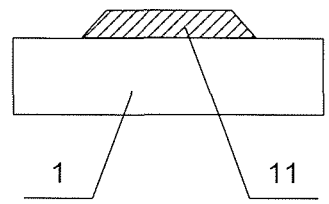
Fig.2a Fig.2b
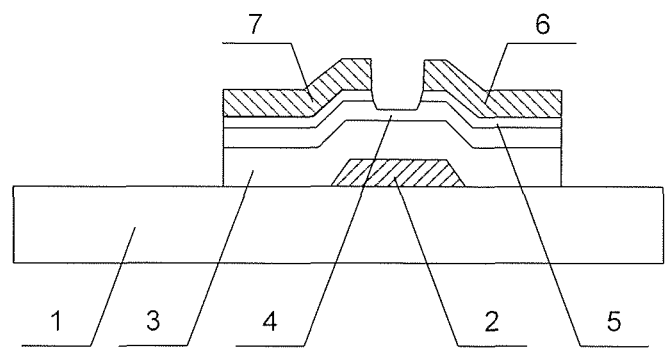
Fig.3a
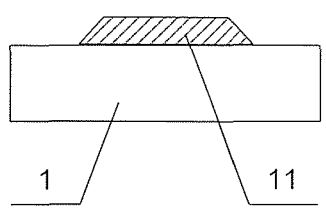
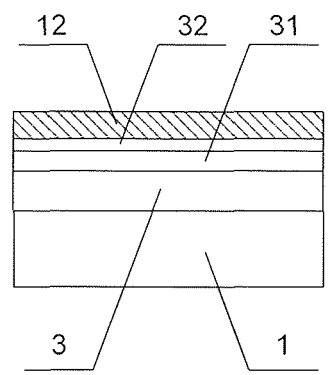
Fig.3b Fig.3c

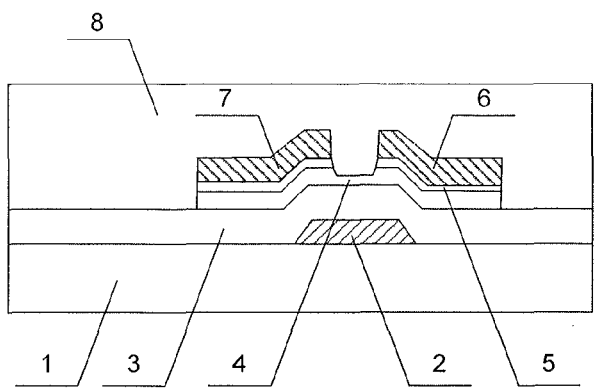
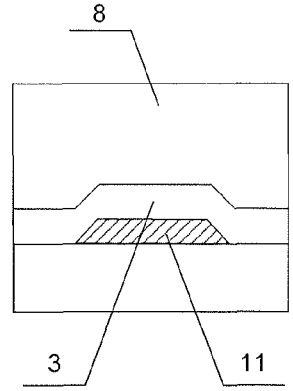
Fig.11a
(Prior Art)
Fig.11b
(Prior Art)
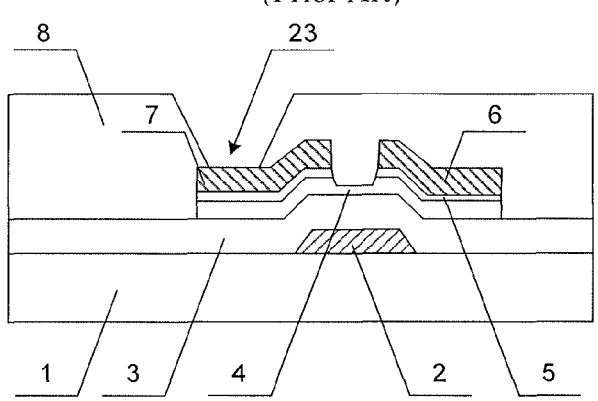
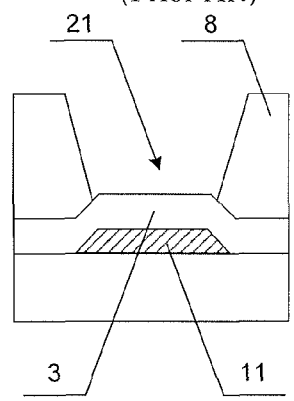
Fig.12a
(Prior Art)
Fig.12b
(Prior Art)
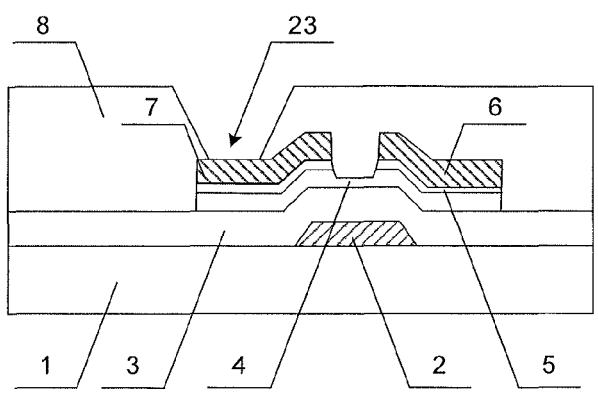
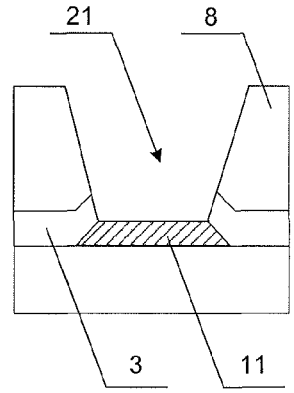
Fig.13a
(Prior Art)
Fig.13b
(Prior Art)

TFT-LCD ARRAY SUBSTRATE AND MANUFACTURING METHOD THEREOF

BACKGROUND

Embodiments of the present invention relate to a thin film transistor liquid crystal display and a manufacturing method thereof.

Thin film transistor liquid crystal displays (TFT-LCDs) have been developed rapidly in recent ten years and have prevailed in the market of flat panel display.

A TFT-LCD mainly comprises an array substrate, a color filter substrate and a liquid crystal layer sandwiched between the array substrate and the color filter substrate. For example, the array substrate of the TFT-LCD is typically manufactured by a 4-mask patterning process. The 4-mask patterning process may comprise the following steps: forming a gate line and a gate electrode by a first patterning process with a normal mask; forming an active layer, a data line, a source electrode, a drain electrode and a TFT channel region by a second patterning process with a half-tone mask or a gray-tone mask; forming a passivation layer via hole, a gate pad via hole and a data pad via hole by a third patterning process with a normal mask; and forming a pixel electrode by a fourth patterning process with a normal mask. The pixel electrode is connected with the drain electrode through the passivation layer via hole.

In manufacturing the array substrate of the TFT-LCD, the step of forming via holes is a very important step. Through the via holes formed in this step, the pixel electrode is connected with the drain electrode of the thin film transistor, and desirable connections are obtained at the gate pad region and the data pad region. FIG. 11a to FIG. 13b are views showing a process of forming via holes in a conventional method of manufacturing a TFT-LCD array substrate, and the process of forming via holes is described as follows.

FIGS. 11a and 11b are structural views after applying a photoresist layer in the conventional method of manufacturing a TFT-LCD array substrate. FIG. 11a is a sectional view taken at the position of a thin film transistor, and FIG. 11b is a sectional view taken at the position of a gate pad region. On the substrate with a gate line 11, a gate electrode 12, a gate insulating layer 3, an active layer (comprising a semiconductor layer 4 and a doped semiconductor layer 5), a date line, a source electrode 6 and a drain electrode, a photosensitive resin layer 8 is applied, as shown in FIG. 11a and FIG. 11b.

FIGS. 12a and 12b are structural views after an exposing and developing process in the conventional method of manufacturing a TFT-LCD array substrate. FIG. 12a is a sectional view taken at the position of the thin film transistor, and FIG. 12b is a sectional view taken at the position of the gate pad region. The photoresist layer is exposed by using a normal mask and then developed to form a first via hole 21 and a third via hole 23. The first via hole 21 is provided above the gate line 11 in the gate pad region to expose a portion of the gate insulating layer 3, and the third via hole 23 is provided above the drain electrode 7 of the thin film transistor to expose a portion of the drain electrode, as shown in FIGS. 12a and 12b.

FIGS. 13a and 13b are structural views after an etching process in the conventional method of manufacturing a TFT-LCD array substrate. FIG. 13a is a sectional view taken at the position of the thin film transistor, and FIG. 13b is a sectional view taken at the position of the gate pad region. By the etching process, the gate insulating layer 3 in the second via hole 22 is etched away to expose a portion of the gate line 11, as shown in FIGS. 13a and 13b.

In above-described process of forming via holes, an etching process is included and many apparatus are employed. Therefore, the above process has the disadvantages of low production efficiency, high manufacture cost and the like.

SUMMARY

According to an embodiment of the invention, a method of manufacturing a thin film transistor liquid crystal display (TFT-LCD) array substrate is provided. The method comprises:

forming a gate line and a gate electrode on a base substrate and then depositing a gate insulating layer on the base substrate;

forming an active layer, a data line, a source electrode, and a drain electrode on the gate insulating layer, and removing the gate insulating layer in the region other than the regions of the active layer, the data line, the source electrode and the drain electrode;

forming a photosensitive resin layer on the base substrate formed with the above patterns, and forming a first via hole, a second via hole and a third via hole in the photoresist layer by an exposing and developing process, wherein the first via hole is provided in a gate pad region, the second via hole is provided in a data pad region, and the third via hole is provided at the drain electrode; and forming a pixel electrode, a first connection electrode and a second connection electrode on the photosensitive resin layer, wherein the first connection electrode is connected with the gate line through the first via hole, the second connection electrode is connected with the data line through the second via hole, and the pixel electrode is connected with the drain electrode through the third via hole.

According to another embodiment of the invention, a TFT-LCD array substrate is provided. The TFT-LCD array substrate is manufactured by the above method.

According to still another embodiment of the invention, a TFT-LCD array substrate is provided. The TFT-LCD array substrate comprises a gate line, a data line, a gate insulating layer, a thin film transistor and a pixel electrode. The thin film transistor and the pixel electrode is provided in a pixel region defined by intersecting of the gate line and the date line, and the gate insulating layer is only provided below the data line and in a region where the thin film transistor is formed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 2a and FIG. 2b are structural views after a first patterning process in the method of manufacturing a TFT-LCD array substrate according to the embodiment;

FIGS. 3a, 3b and 3c are structural views after a second patterning process in the method of manufacturing a TFT-LCD array substrate according to the embodiment;

FIG. 11a and 11b are structural views after applying a photoresist layer in a conventional method of manufacturing a TFT-LCD array substrate;

FIGS. 12a and 12b are structural views after an exposing and developing process in the conventional method of manufacturing a TFT-LCD array substrate; and FIGS. 13a and 13b are structural views after an etching process in the conventional method of manufacturing a TFT-LCD array substrate.

DETAILED DESCRIPTION

Hereinafter, the embodiments will be described in detail with reference to the accompanying drawings.

A method of manufacturing a TFT-LCD array substrate according to an embodiment comprises:

Step 1 of forming a gate line and a gate electrode on a base substrate by a patterning process and then depositing a gate insulating layer on the base substrate;

Step 2 of forming patterns of an active layer, a data line, a source electrode, and a drain electrode on the gate insulating layer by a patterning process, and simultaneously removing the gate insulating layer in the region other than the regions of above patterns;

Step 3 of applying a photoresist layer on the base substrate after Step 2, and forming a first via hole, a second via hole and a third via hole in the photoresist layer by an exposing and developing process, wherein the first via hole is provided in a gate pad region, the second via hole is provided in a data pad region, and the third via hole is provided at the drain electrode; and Step 4 of forming a pixel electrode, a first connection electrode and a second connection electrode on the photosensitive resin layer by a patterning process, wherein the first connection electrode is connected with the gate line through the first via hole, the second connection electrode is connected with the data line through the second via hole, and the pixel electrode is connected with the drain electrode through the third via hole.

According to this embodiment, since the gate insulating layer in the region other than the regions of the active layer, the data line, the source electrode and the drain electrode has been removed in Step 2, the via holes can be formed in the Step 3 without performing an etching process. Therefore, the manufacture process can be simplified, the production efficiency can be improved, the manufacture cost can be reduced and the yield can be increased.

Figure 1:
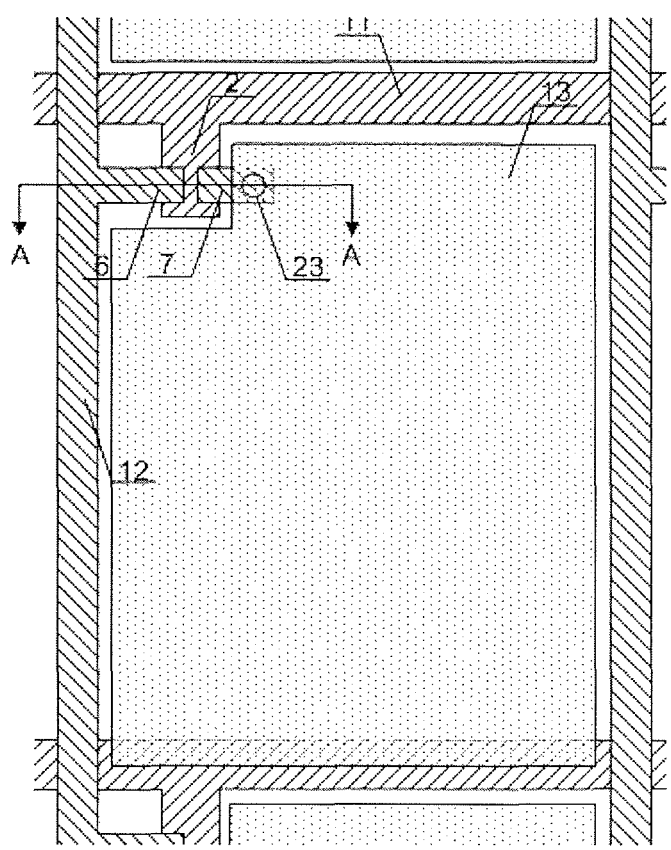
FIG. 1 is a plan view showing a TFT-LCD array substrate manufactured by a method according to an embodiment.

FIG. 1 is a plan view showing a TFT-LCD array substrate manufactured by the above-described method according to the embodiment, in which only one pixel unit is shown.

The TFT-LCD array substrate mainly comprises the gate line 11, the data line 12, the pixel electrode 13 and a thin film transistor. The gate line 11 and the data line 12 are perpendicular to each other. A pixel region is defined by intersecting of the gate line 11 and the data line 12. The thin film transistor and the pixel electrode 13 are formed in the pixel region. The gate line 11 is used to supply an "ON" or "OFF" signal to the thin film transistor, and the data line 12 is used to supply a data signal to the pixel electrode 13.

FIG. 2a to FIG. 10c are views showing the processes employed in the method of manufacturing a TFT-LCD array substrate according to the embodiment. In addition, the patterning process described here comprises applying photoresist, masking, exposing and developing of photoresist, etching, removing remaining photoresist and the like, and a positive photoresist is employed as an example.

FIG. 2a and FIG. 2b are structural views after a first patterning process in the method of manufacturing a TFT-LCD array substrate according to the embodiment. FIG. 2a is a sectional view taken along line A-A in FIG. 1, and FIG. 2b is a sectional view taken at the gate pad region.

Firstly, a gate metal film is deposited on the substrate 1 (such as a glass substrate or a quartz substrate) by a magnetron sputtering method or a thermal evaporation method. The gate metal film may be a sing-layer film of molybdenum, aluminum, alloy of aluminum and nickel, alloy of molybdenum and tungsten, chromium, copper and the like, or may be a composite film formed of multiple layers of any combination of the above metals. The gate metal film is patterned by using a normal mask to form the gate line 11 and the gate electrode 2 on the substrate 1, as shown in FIG. 2a and FIG. 2b.

FIGS. 3a, 3b and 3c are structural views after a second patterning process in the method of manufacturing a TFT-LCD array substrate according to the embodiment. FIG. 3a is a sectional view taken along line A-A in FIG. 1, FIG. 3b is a sectional view taken at the gate pad region, and FIG. 3c is a sectional view taken at the data pad region.

On the substrate with the patterns shown in FIG. 2a and FIG. 2b, a gate insulating layer, a semiconductor film and a doped semiconductor film are sequentially deposited by a plasma enhanced chemical vapor deposition (PECVD) method, and then a source/drain metal film is deposited by a magnetron sputtering method or a thermal evaporation method. The gate insulating layer 3 may be formed by silicon oxide, silicon nitride, silicon oxynitride and the like. The source/drain metal film may be a sing-layer film of molybdenum, aluminum, alloy of aluminum and nickel, alloy of molybdenum and tungsten, chromium, copper and the like, or may be a composite film formed of multiple layers of any combination of the above metals. In the second patterning process, the active layer, the data line 12, the source electrode 6 and the drain electrode 7 are formed by using a half-tone mask or a gray-tone mask, and the gate insulating layer in the region other than the regions of the active layer, the data line 12, the source electrode 6 and the drain electrode 7 is simultaneously removed, as shown in FIGS. 3a, 3b and 3c. The second patterning process is a patterning process comprises multiple etching steps, and the details thereof are described as follows.

Figure 4A:
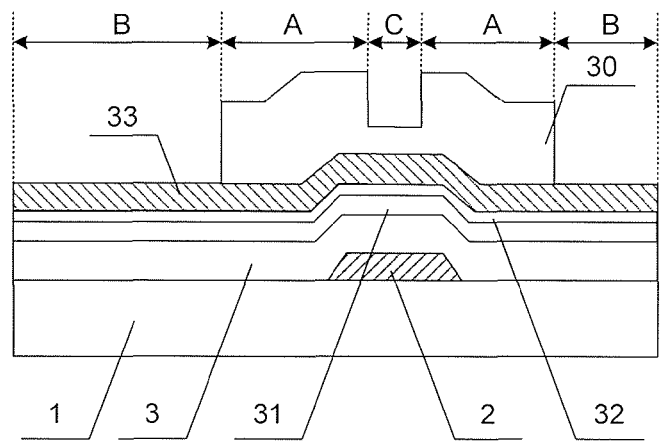
FIGS. 4a, 4b and 4c are structural views after exposing and developing a photoresist layer in the second patterning process in the method of manufacturing a TFT-LCD array substrate according to the embodiment.
Figure 4B:
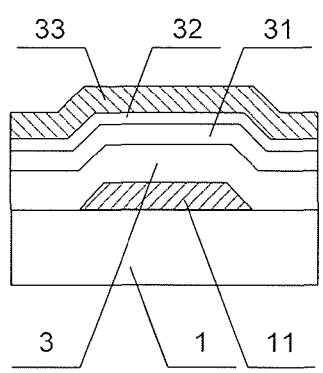
Figure 4C:
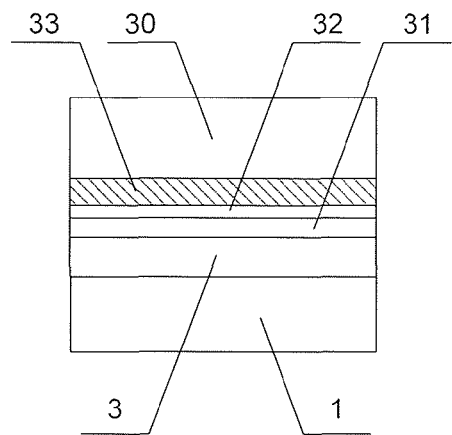

FIGS. 4a, 4b and 4c are structural views after exposing and developing a photoresist layer in the second patterning process in the method of manufacturing a TFT-LCD array substrate according to the embodiment. FIG. 4a is a sectional view taken along line A-A in FIG. 1, FIG. 4b is a sectional view taken at the gate pad region, and FIG. 4c is a sectional view taken at the data pad region.

The gate insulating layer 3, the semiconductor film 31 and the doped semiconductor film 32 are sequentially deposited, and then the source/drain metal film 33 is deposited thereon. A photoresist layer 30 is applied on the source/drain metal film 33. Then, the photoresist layer 30 is exposed by using a half-tone mask or a gray-tone mask and developed to form an unexposed region A (i.e., a photoresist-completely-remained region), a completely exposed region B (i.e., a photoresist-completely-removed region) and a partially exposed region C (i.e., a photoresist-partially-remained region). The unexposed region A corresponds to the region of the data line, the source electrode and the drain electrode, the partially exposed region C corresponds to a TFT channel region formed between the source electrode and the drain electrode, and the completely exposed region B corresponds to the region other than the above regions, as shown in FIG. 4a to FIG. 4c. In addition, the completely exposed region comprises the gate pad region shown in FIG. 4b, and the unexposed region comprises the data pad region shown in FIG. 4c.

Figure 5A:
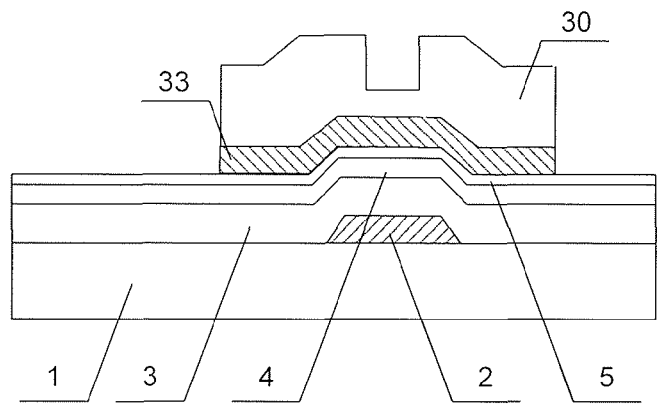
FIGS. 5a, 5b and 5c are structural views after a first etching stage of a first etching process in the second patterning process in the method of manufacturing a TFT-LCD array substrate according to the embodiment.
Figure 5B:
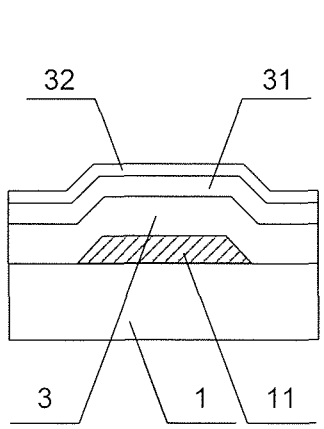
Figure 5C:
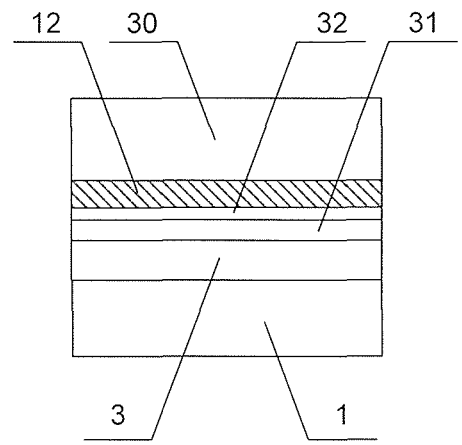

FIGS. 5a, 5b and 5c are structural views after a first etching stage of a first etching process in the second patterning process in the method of manufacturing a TFT-LCD array substrate according to the embodiment. FIG. 5a is a sectional view taken along line A-A in FIG. 1, FIG. 5b is a sectional view taken at the gate pad region, and FIG. 5c is a sectional view taken at the data pad region. The source/drain metal film in the completely exposed region is etched away by a wet etching process to form the data line 12, as shown in FIGS. 5a to 5c.

Figure 6A:
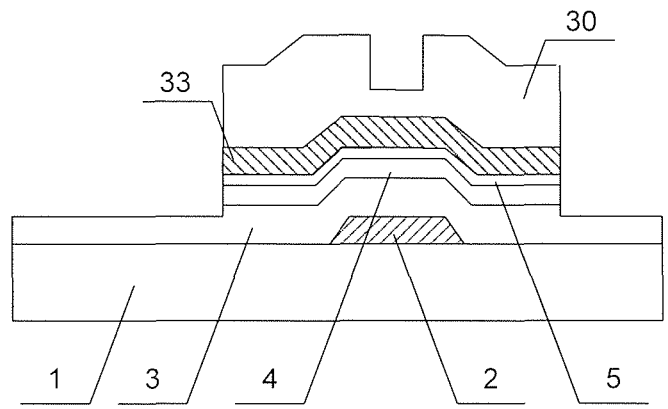
FIGS. 6a, 6b and 6c are structural views after a second etching stage of the first etching process in the second patterning process in the method of manufacturing a TFT-LCD array substrate according to the embodiment.
Figure 6B:
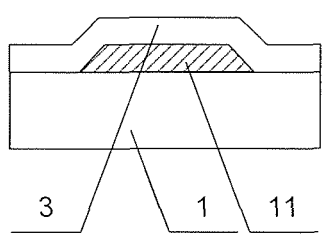
Figure 6C:
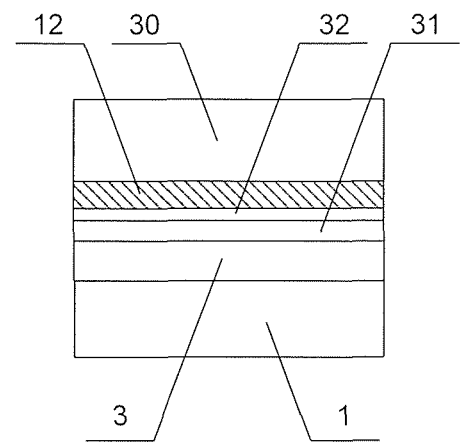

FIGS. 6a, 6b and 6c are structural views after a second etching stage of the first etching process in the second patterning process in the method of manufacturing a TFT-LCD array substrate according to the embodiment. FIG. 6a is a sectional view taken along line A-A in FIG. 1, FIG. 6b is a sectional view taken at the gate pad region, and FIG. 6c is a sectional view taken at the data pad region. By a dry etching process, the doped semiconductor film 32 and the semiconductor film 31 in the completely exposed region is etched away and the gate insulating layer 3 in this region is partially etched in the thickness direction thereof so that the active layer is formed, as shown in FIGS. 6a to 6c.

Figure 7A:
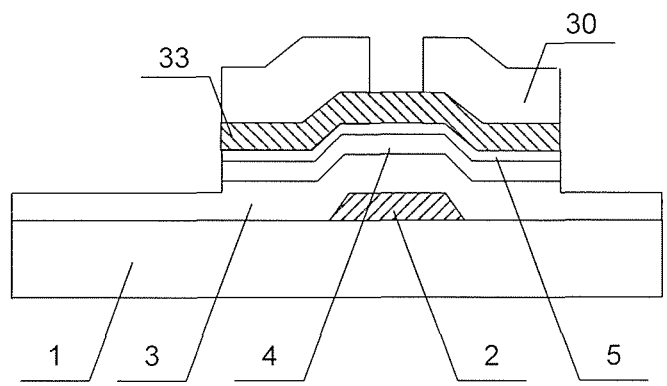
FIGS. 7a, 7b and 7c are structural views after an ashing process in the second patterning process in the method of manufacturing a TFT-LCD array substrate according to the embodiment.
Figure 7B:
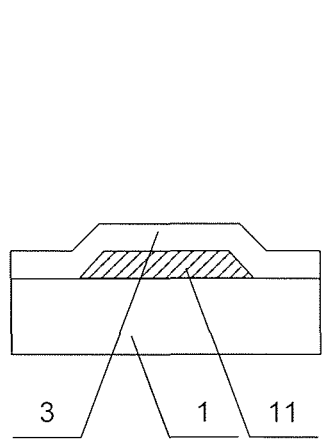
Figure 7C:
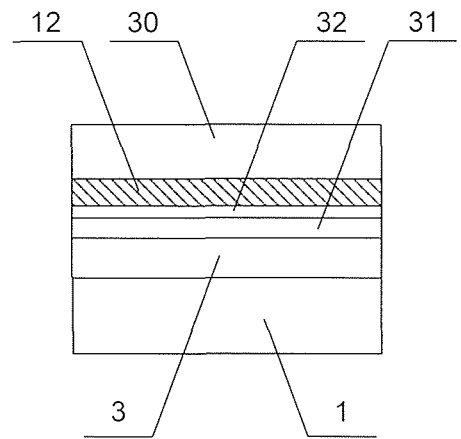

FIGS. 7a, 7b and 7c are structural views after an ashing process in the second patterning process in the method of manufacturing a TFT-LCD array substrate according to the embodiment. FIG. 7a is a sectional view taken along line A-A in FIG. 1, FIG. 7b is a sectional view taken at the gate pad region, and FIG. 7c is a sectional view taken at the data pad region. By the ashing process, the thickness of the photoresist layer 30 is decreased. The photoresist layer in the partially exposed region is removed to expose the source/drain metal film in this region, and the photoresist layer in the unexposed region is remained with a decreased thickness, as shown in FIG. 7a to FIG. 7b.

Figure 8A:
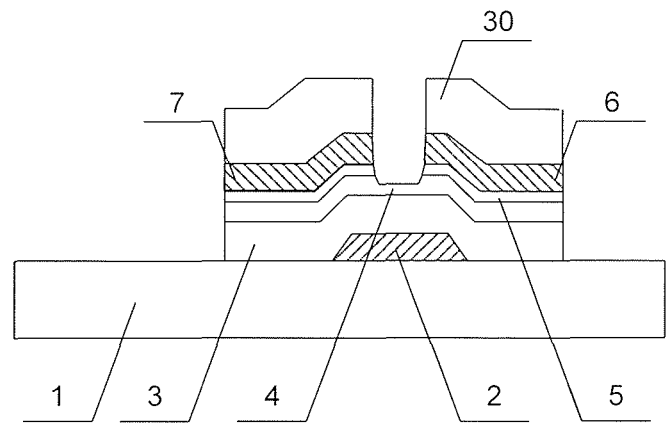
FIGS. 8a, 8b and 8c are structural views after a second etching process in the second patterning process in the method of manufacturing a TFT-LCD array substrate according to the embodiment.
Figure 8B:
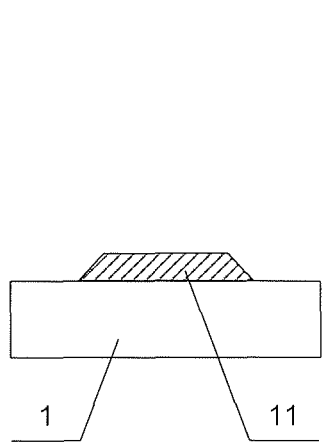
Figure 8C:
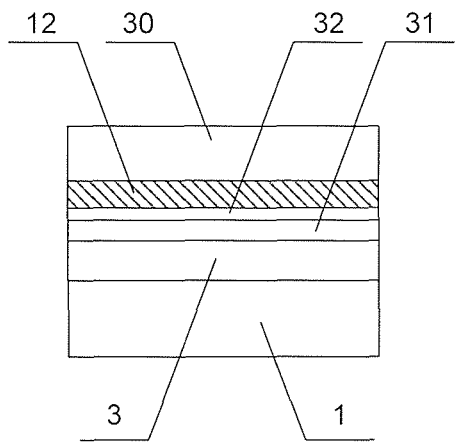

FIGS. 8a, 8b and 8c are structural views after a second etching process in the second patterning process in the method of manufacturing a TFT-LCD array substrate according to the embodiment. FIG. 8a is a sectional view taken along line A-A in FIG. 1, FIG. 8b is a sectional view taken at the gate pad region, and FIG. 8c is a sectional view taken at the data pad region. By the second etching process, the source/drain metal film 33 and the doped semiconductor layer 5 in the partially exposed region are etched away and the semiconductor layer 4 in this region is partially etched in the thickness direction thereof so that the source electrode 6, the drain electrode 7 and the TFT channel region are formed, and at the same time, the remaining gate insulating layer 3 in the completely exposed region is etched away to expose the gate line 11, as shown in FIG. 8a to FIG. 8c.

Then, the remaining photoresist layer is removed to complete the second patterning process in the method of manufacturing a TFT-LCD array substrate according to the embodiment. After the second patterning process is completed, the active layer (the laminate of the semiconductor layer 4 and the doped semiconductor layer 3) is formed on the gate insulating layer 3 and positioned above the gate electrode 2. The source electrode 6 and the drain electrode 7 are formed on the active layer. One end of the source electrode 6 is provided above the gate electrode 2, and the other end thereof is connected with the data line 12. One end of the drain electrode 7 is provided above the gate electrode 2 and opposite to source electrode. The TFT channel region is formed between the source electrode 6 and the drain electrode 7. In the TFT channel region, the doped semiconductor layer 5 is etched away and the semiconductor layer 4 is partially etched in the thickness direction thereof so that the semiconductor layer 4 is exposed in this channel region. In the region other than the regions of the active layer, the data line 12 and the overlapping region of the data line 12 and the gate line 11, the gate insulating layer 3 is etched away to expose the gate line 11 in the gate pad region and expose the data line 12 in the data pad region, as shown in FIGS. 3a to 3b. In addition, the doped semiconductor film 32 and the semiconductor film 31 is remained below the data line 12.

Figure 9A:
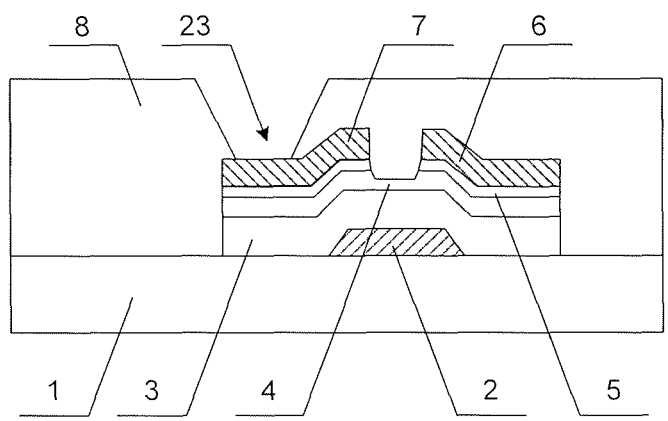
FIGS. 9a, 9b and 9c are structural views after a third patterning process in the method of manufacturing a TFT-LCD array substrate according to the embodiment.
Figure 9B:
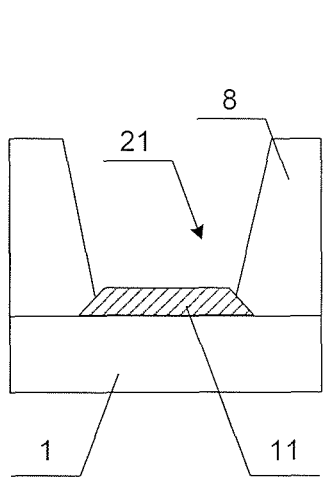
Figure 9C:
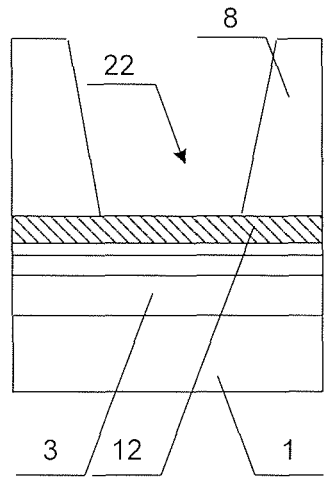

FIGS. 9a, 9b and 9c are structural views after a third patterning process in the method of manufacturing a TFT-LCD array substrate according to the embodiment. FIG. 9a is a sectional view taken along line A-A in FIG. 1, FIG. 9b is a sectional view taken at the gate pad region, and FIG. 9c is a sectional view taken at the data pad region.

On the substrate with the pattern shown in FIG. 3a to FIG. 3c, the photosensitive resin layer 8 is applied by a spin coating method and the like. The photosensitive resin layer 8 is exposed by a normal mask and developed to form the first via hole 21, the second via hole 22 and the third via hole 23. The first via hole 21 is provided at the gate pad region to expose a portion of the gate line 11, the second via hole 22 is provided at the data pad region to expose a portion of the data line, and the third via hole 23 is provided at the drain electrode 7 to expose a portion of the drain electrode, as shown in FIG. 9a to FIG. 9c. Since the coating method is employed to apply the photosensitive resin layer on the base substrate, the photosensitive resin layer has a flat surface. In the conventional method, a passivation layer (such as SiNx) with a dielectric constant of about 6.5 and a thickness of 0.5 µm to 0.8 µm is employed. However, in this embodiment, the photosensitive resin layer 8 has a thickness of 1.5 µm to 5 µm and a dielectric constant of 2.4 to 4.0, thus the dielectric characteristic is improved, and therefore the brightness uniformity and anti-interference capability can be improved.

Figure 10A:
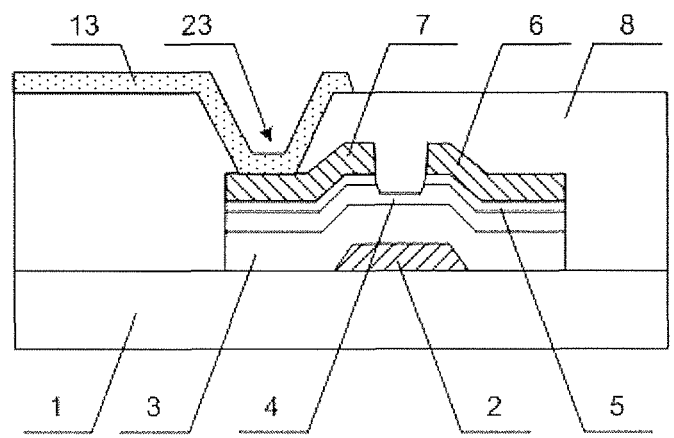
FIGS. 10a, 10b and 10c are structural views after a fourth patterning process in the method of manufacturing a TFT-LCD array substrate according to the embodiment.
Figure 10B:
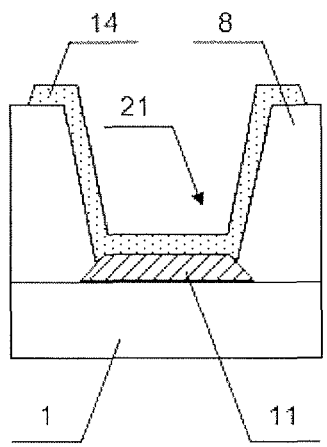
Figure 10C:
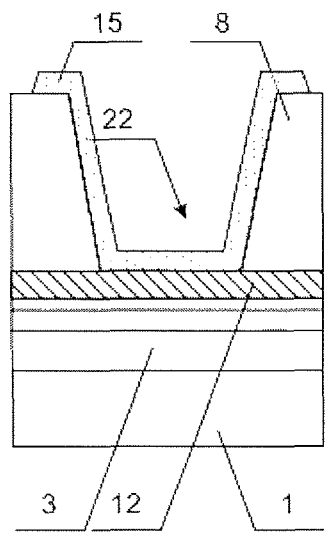

FIGS. 10a, 10b and 10c are structural views after a fourth patterning process in the method of manufacturing a TFT-LCD array substrate according to the embodiment. FIG. 10a is a sectional view taken along line A-A in FIG. 1, FIG. 10b is a sectional view taken at the gate pad region, and FIG. 10c is a sectional view taken at the data pad region.

On the substrate with the pattern shown in FIGS. 9a to 9b, a transparent conductive film is deposited by a magnetron sputtering method or a thermal evaporation method. The transparent conductive film may be formed by indium tin oxide (ITO), indium zinc oxide (IZO), aluminum zinc oxide (AZO) and the like, or may be formed by other transparent metal or metal oxide. The transparent conductive film is patterned by using a normal mask to form the pixel electrode 13, the first connection electrode 14 and the second connection electrode 15. The first connection electrode 14 is provided at the first via hole 21 and connected with the gate line 11 through the first via hole 21, the second connection electrode 15 is provided at the second via hole 22 and connected with the data line 12 through the second via hole 22, and the pixel electrode 13 is formed within the pixel region and connected with the drain electrode 7 through the third via hole 23, as shown in FIG. 10a to FIG. 10c.

In this embodiment, the second etching process in the second patterning process may be completed by various ways and the details thereof are further described as follows.

In a first example of the method of manufacturing a TFT-LCD array substrate according to the embodiment, a dry etching method is employed, and the second etching process in the second patterning process comprises the following steps.

Step 11 of etching away the source/drain metal film in the photoresist-partially-remained region and partially etching the gate insulating layer in the photoresist-completely-removed region in the thickness direction thereof by a first dry etching stage;

Step 12 of etching away the doped semiconductor layer in the photoresist-partially-remained region and partially etching the semiconductor layer in this region in the thickness direction thereof by a second dry etching stage, and partially etching the gate insulating layer in the photoresist-completely-removed region in the thickness direction thereof by the second dry etching stage; and Step 13 of etching away the remaining gate insulating layer in the photoresist-completely-removed region by a third dry etching stage to expose the underlying gate line, and modifying the semiconductor layer in the photoresist-partially-remained region to form the TFT channel region also by the third dry etching stage.

In this example, the second etching process is completed by three separate etching stages so that the processing parameters in each stage can be selected according to the object to be etched and thus the processing quality can be improved. In the first dry etching stage, the main object to be etched is the source/drain metal film in the partially exposed region, and only a small portion of the gate insulating layer in the completely exposed region is etched. In addition, a small amount of inert gas may be employed to improve the etch uniformity. In the second dry etching stage, the main object to be etched is the doped semiconductor layer and the semiconductor layer in the partially exposed region. On the other hand, since the gate insulating layer can be similarly etched when the doped semiconductor layer and semiconductor layer are etched, a relatively large portion of the gate insulating layer in the completely exposed region is etched, that is, the thickness of the gate insulating layer in the completely exposed region is significantly decreased. In the third dry etching stage, the main object to be etched is the remaining gate insulating layer in the completely exposed region. On the other hand, the semiconductor layer in the partially exposed region is similarly etched when the gate insulating layer is etched and thus modified to form the TFT channel region.

For example, the thickness of the gate insulating layer may be 3600 Å to 4400 Å, the thickness of the semiconductor film may be 1500 Å to 2100 Å, the thickness of the doped semiconductor film may be 400 Å to 600 Å, and the thickness of the source/drain metal film may be 2000 Å to 2400 Å. In the first etching stage in the first etching process, a wet etching process is employed and thus only the source/drain metal film in the photoresist-completely-removed region is completely removed. In the second etching stage in the first etching process, the doped semiconductor film and the semiconductor film in the photoresist-completely-removed region is completely removed, and the gate insulating layer in this region is etched by a thickness of 2100 Å to 2200 Å. In the first dry etching stage in the second etching process, a dry etching process is employed, the source/drain metal film in the photoresist-partially-remained region is etched away, and the gate insulating layer in the photoresist-completely-removed region is simultaneously etched by a thickness of 100 Å to 300 Å. In the second dry etching stage in the second etching process, the doped semiconductor film in the photoresist-partially-remained region of a thickness of 400 Å to 600 Å is etched, the semiconductor film in the photoresist-partially-remained region of a thickness of 800 Å to 1000 Å is etched, and the gate insulating layer in the photoresist-completely-removed region is etched by a thickness of 1200 Å to 1600 Å. Here, the thickness of the gate insulating layer in the photoresist-completely-removed region becomes 200 Å to 300 Å. In the third dry etching stage in the second etching process, the remaining gate insulating layer with the thickness of 200 Å to 300 Å is etched away, and at the same time, the semiconductor layer in the TFT channel region is modified.

In this example, a dry etching method is respectively employed from the second etching stage in the first etching process to the third dry etching stage in the second etching process, and thus the dry etching processes cane be continuously performed in the same apparatus.

In a second example of the method of manufacturing a TFT-LCD array substrate according to the embodiment, an ashing process is employed, and the second etching process in the second patterning process comprises the following steps.

Step 21 of etching away the source/drain metal film in the photoresist-partially-remained region and partially etching the gate insulating layer in the photoresist-completely-removed region in the thickness direction thereof by a first dry etching stage;

Step 22 of decreasing the thickness of the photoresist layer and reducing the region covered by the photoresist layer by an ashing process;

Step 23 of etching away the doped semiconductor layer in the photoresist-partially-remained region and partially etching the semiconductor layer in this region in the thickness direction thereof by a second dry etching stage, and partially etching the gate insulating layer in the photoresist-completely-removed region in the thickness direction thereof by the second dry etching stage; and Step 24 of etching away the remaining gate insulating layer in the photoresist-completely-removed region by a third dry etching stage to expose the gate line, and modifying the semiconductor layer in the photoresist-partially-remained region to form the TFT channel region by the third dry etching stage.

The second example is similar to the first example except that the ashing process is performed between the first dry etching stage and the second dry etching stage. By the ashing process, the thickness of the photoresist layer is decreased and the region covered by the photoresist layer is reduced, and thus the doped semiconductor film in the TFT channel region is completely exposed. In this way, it can be secured that no residual doped semiconductor film is remained TFT channel region in the subsequent dry etching stage, and thus the etching quality of the TFT channel region can be improved.

In a third example of the method of manufacturing a TFT-LCD array substrate according to the embodiment, both a wet etching method and a dry etching method are employed and the second etching process in the second patterning process comprises the following steps.

Step 31 of etching away the source/drain metal film in the photoresist-partially-remained region by a first wet etching stage;

Step 32 of decreasing the thickness of the photoresist layer and reducing the region covered by the photoresist layer by an ashing process;

Step 33 of etching away the doped semiconductor layer in the photoresist-partially-remained region and partially etching the semiconductor layer in this region in the thickness direction thereof by a second dry etching stage, and partially etching the gate insulating layer in the photoresist-completely-removed region in the thickness direction thereof by the second dry etching stage; and Step 34 of etching away the remaining gate insulating layer in the photoresist-completely-removed region by a third dry etching stage to expose the gate line, and modifying the semiconductor layer in the photoresist-partially-remained region to form the TFT channel region by the third dry etching stage.

The third example is similar to the second example except that the first wet etching stage is employed instead of the first dry etching stage. In the case that the source/drain metal film is formed by metals (such as Al or AlNd) which are difficult to be processed by the dry etching process, the third example may be applied to complete the etching of the source/drain metal film.

In addition, according to another embodiment, a TFT-LCD array substrate is further provided. The TFT-LCD array substrate is manufactured by the method of manufacturing a TFT-LCD array substrate according to the previous embodiment. As shown in FIG. 1 and FIGS. 10a to 10c, the TFT-LCD array substrate in this embodiment mainly comprises the gate line 11, the data line 12, the pixel electrode 13 and the thin film transistor. The gate line 11 and the data line 12 are perpendicular to each other. The pixel region is defined by intersecting of the gate line 11 and the data line 12. The thin film transistor and the pixel electrode 13 are formed in the pixel region. The gate line 11 is used to supply an ON or OFF signal to the thin film transistor, and the data line 12 is used to supply a data signal to the pixel electrode 13. The thin film transistor comprises the gate electrode 2, the active layer, the source electrode 6 and the drain electrode 7. The gate electrode 2 and the gate line 11 are formed on the base substrate 1. The gate electrode 2 is connected with the gate line 11. The gate insulating layer 3 is formed in the region of the gate electrode 2 and in the overlapping region between the gate line 11 and the data line 12. The active layer (comprising the semiconductor layer 4 and the doped semiconductor layer 5) is formed on the gate insulating layer 3 and provided over the gate electrode 2. The source electrode 6 and the drain electrode 7 are formed on the active layer. One end of the source electrode 6 is provided above the gate electrode 2, and the other end thereof is connected with the data line 12. One end of the drain electrode 7 is provided above the gate electrode 2, and the other end thereof is connected with the pixel electrode 13. The TFT channel region is formed between the source electrode 6 and the drain electrode 7. In the TFT channel region, the doped semiconductor layer 5 is etched away and the semiconductor layer 4 is partially etched in the thickness direction thereof so that the semiconductor layer 4 is exposed in this channel region. The photosensitive resin layer 8 is formed on the data line 12, the source electrode 6 and the drain electrode 7, and covers the entirety of the substrate 1. The first via hole 21 is formed in the gate pad region, the second via hole 22 is formed in the data pad region, and the third via hole is formed at the drain electrode 7. The pixel electrode 13, the first connection electrode 14 and the second connection electrode 15 are formed on the photosensitive resin layer 8. The first connection electrode is formed at the first via hole 21 and connected with the gate line 11 through the first via hole 21, the second connection electrode 15 is formed at the second via hole 22 and connected with the data line 12 through the second via hole 22, and the pixel electrode 13 is formed within the pixel region and connected with drain electrode 7 through the third via hole 23.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A method of manufacturing a thin film transistor liquid crystal display (TFT-LCD) array substrate, comprising:

forming a gate line and a gate electrode on a base substrate and then depositing a gate insulating layer on the base substrate;

forming an active layer, a data line, a source electrode, and a drain electrode on the gate insulating layer and removing the gate insulating layer in the region other than the regions of the active layer, the data line, the source electrode and the drain electrode;

forming a photosensitive resin layer on the base substrate formed with the above patterns, and forming a first via hole, a second via hole and a third via hole in the photoresist layer by an exposing and developing process, wherein the first via hole is provided in a gate pad region, the second via hole is provided in a data pad region, and the third via hole is provided at the drain electrode; and forming a pixel electrode, a first connection electrode and a second connection electrode on the photosensitive resin layer, wherein the first connection electrode is connected with the gate line through the first via hole, the second connection electrode is connected with the data line through the second via hole, and the pixel electrode is connected with the drain electrode through the third via hole.

2. The method of manufacturing a TFT-LCD array substrate according to claim 1, wherein the step of forming an active layer, the data line, the source electrode, and the drain electrode on the gate insulating layer and removing the gate insulating layer in the region other than the regions of the active layer, the data line, the source electrode and the drain electrode comprises:

sequentially forming a semiconductor film, a doped semiconductor film and source/drain metal film on the gate insulating layer;

applying a photoresist layer on the source/drain metal film, exposing the photoresist layer by using a half-tone mask or a gray-tone mask and performing a developing process to form a photoresist-completely-remained region, a photoresist-completely-removed region and a photoresist-partially-remained region, wherein photoresist-completely-remained region corresponds to the region of the data line, the source electrode and the drain electrode, the photoresist-partially-remained region corresponds to a TFT channel region formed between the source electrode and the drain electrode, and the photoresist-completely-removed region corresponds to the region other than the above regions;

etching away the source/drain metal film in the photoresist-completely-removed region by a wet etching process;

etching away the doped semiconductor film and the semiconductor film in the photoresist-completely-removed region and partially etching the gate insulating layer in the thickness direction thereof in the photoresist-completely-removed region by a dry etching process;

removing the photoresist layer in the photoresist-partially-remained region by an ashing process to expose the source/drain metal film in this region, and simultaneously decreasing the thickness of the photoresist layer in the photoresist-completely-remained region;

etching away the source/drain metal film and the doped semiconductor film in the photoresist-partially-remained region and partially etching the semiconductor film in the thickness direction thereof in the photoresist-partially-remained region and simultaneously etching away the gate insulating layer in the photoresist-completely-remained region; and removing remaining photoresist layer.

3. The method of manufacturing a TFT-LCD array substrate according to claim 2, wherein the step of etching away the source/drain metal film and the doped semiconductor film in the photoresist-partially-remained region and partially etching the semiconductor film in the thickness direction thereof in the photoresist-partially-remained region and simultaneously etching away the gate insulating layer in the photoresist-completely-remained region comprises:

by a first dry etching stage, etching away the source/drain metal film in the photoresist-partially-remained region and partially etching the gate insulating layer in the thickness direction thereof in the photoresist-completely-removed region;

by a second dry etching stage, etching away the doped semiconductor layer in the photoresist-partially-remained region, partially etching the semiconductor layer in the thickness direction thereof in photoresist-partially-remained region, and partially etching the gate insulating layer in the thickness direction thereof in the photoresist-completely-removed region; and by a third dry etching stage, etching away remaining gate insulating layer in the photoresist-completely-removed region to expose the gate line, and modifying the semiconductor layer in the photoresist-partially-remained region to form the TFT channel region.

4. The method of manufacturing a TFT-LCD array substrate according to claim 3, wherein an ashing process is performed between the first dry etching stage and the second dry etching stage to decrease the thickness of the photoresist layer and reduce the region covered by the photoresist layer.

5. The method of manufacturing a TFT-LCD array substrate according to claim 2, wherein the step of etching away the source/drain metal film and the doped semiconductor film in the photoresist-partially-remained region and partially etching the semiconductor film in the thickness direction thereof in the photoresist-partially-remained region and simultaneously etching away the gate insulating layer in the photoresist-completely-remained region comprises:

by a first wet etching stage, etching away the source/drain metal film in the photoresist-partially-remained region;

by an ashing process, decreasing the thickness of the photoresist layer and reducing the region covered by the photoresist layer;

by a second dry etching stage, etching away the doped semiconductor layer in the photoresist-partially-remained region, partially etching the semiconductor layer in the thickness direction thereof in photoresist-partially-remained region, and partially etching the gate insulating layer in the thickness direction thereof in the photoresist-completely-removed region; and by a third dry etching stage, etching away remaining gate insulating layer in the photoresist-completely-removed region to expose the gate line, and modifying the semiconductor layer in the photoresist-partially-remained region to form the TFT channel region.

6. A thin film transistor liquid crystal display (TFT-LCD) array substrate manufactured by the method according to claim 1.

7. A thin film transistor liquid crystal display (TFT-LCD) array substrate, comprising a gate line, a data line, a gate insulating layer, a thin film transistor and a pixel electrode, wherein the thin film transistor and the pixel electrode is provided in a pixel region defined by intersecting of the gate line and the date line, and the gate insulating layer is only provided below the data line and in a region where the thin film transistor is formed, wherein the thin film transistor comprises a gate electrode, an active layer, a source electrode and a drain electrode, wherein the gate electrode and the gate line are formed on a base substrate, the source electrode and the drain electrode are formed on the active layer, and a TFT channel region is formed between the source electrode and the drain electrode, wherein the TFT-LCD array substrate further comprises a photosensitive resin layer covering the gate line, the data line and the thin film transistor, wherein a first via hole, a second via hole and a third via hole are formed in the photosensitive resin layer, the first via hole is provided in a gate pad region, the second via hole is provided in a data pad region, and the third via hole is provided at the drain electrode of the thin film transistor, and wherein the pixel electrode, a first connection electrode and a second connection electrode are formed on the photosensitive resin layer, the first connection electrode is connected with the gate line through the first via hole, the second connection electrode is connected with the data line through the second via hole, and the pixel electrode is connected with drain electrode through the third via hole.

8. The TFT-LCD array substrate according to claim 7, wherein one end of the source electrode is provided above the gate electrode, and the other end thereof is connected with the data line;

one end of the drain electrode is provided above the gate electrode, and the other end thereof is connected with the pixel electrode;

in the TFT channel region, a doped semiconductor layer is etched away and a semiconductor layer is partially etched in the thickness direction thereof so that the semiconductor layer is exposed in the TFT channel region.

* * * * *